US005367879A

United States Patent [19]

Doke et al.

[11] Patent Number: 5,367,879

[45] Date of Patent: Nov. 29, 1994

[54] MODULAR THERMOELECTRIC ASSEMBLY

[75] Inventors: Michael J. Doke, Dallas; Richard A. Howarth, Allen; Leonard J. Recine, Sr., Plano, all of Tex.

[73] Assignee: Marlow Industries, Inc., Dallas, Tex.

[21] Appl. No.: 146,712

[22] Filed: Nov. 1, 1993

Related U.S. Application Data

[63] Continuation-in-part of Ser. No. 47,695, Apr. 14, 1993, Pat. No. 5,315,830.

[51] Int. Cl.[5] .................. F25B 21/02

[52] U.S. Cl. .................. 62/3.6; 62/3.64; 62/3.7; 62/139

[58] Field of Search .................. 62/3.2, 3.3, 3.6, 3.64, 62/3.7, 139

[56] References Cited

U.S. PATENT DOCUMENTS

| | | | |
|---|---|---|---|
| 3,048,020 | 8/1962 | Jones | 62/3.64 |
| 3,077,079 | 2/1963 | Pietsch . | |
| 3,823,567 | 7/1974 | Corini | 62/3 |
| 4,326,383 | 4/1982 | Reed et al. | 62/3 |
| 4,472,945 | 9/1984 | Cech et al. | 62/3 |
| 4,726,193 | 2/1988 | Burke et al. | 62/3 |
| 4,744,220 | 5/1988 | Kerner et al. | 62/3 |
| 4,833,888 | 5/1989 | Kerner et al. | 62/3.3 |
| 4,934,150 | 6/1990 | Fessler | 62/139 |
| 5,209,069 | 5/1993 | Newman | 62/3 |

FOREIGN PATENT DOCUMENTS

| | | | |
|---|---|---|---|
| 1125957 | 3/1962 | Germany | 62/3.64 |
| 1198837 | 8/1965 | Germany | 62/3.7 |
| 3020580 | 1/1991 | Japan | 62/3.2 |
| 8101739 | 6/1981 | WIPO | 62/3.6 |
| 8504948 | 11/1985 | WIPO | 62/3.6 |

*Primary Examiner*—John M. Sollecito
*Attorney, Agent, or Firm*—Baker & Botts

[57] ABSTRACT

A modular thermoelectric assembly is provided to maintain the temperature within a container or enclosed structure holding water or other liquids at a desired value. The thermoelectric assembly includes a thermoelectric device with a hot sink and a cold sink. A layer of insulating material is disposed between the hot sink and the cold sink. The hot sink and the insulating material are used to install the thermoelectric assembly into an appropriately sized opening extending through the exterior of the container or enclosed structure. A thermoelectric device, contained within the layer of insulating material, functions as a heat pump to transfer heat between the cold sink and the hot sink. An electrical motor, rotating shaft and propeller are carried by the assembly to assist in the circulation of air to improve the efficiency of the cold sink and the hot sink. Another propeller and/or impeller may be carried by the rotating shaft to assist with circulation of liquids in the container or enclosed structure.

28 Claims, 4 Drawing Sheets

20

22
94
92
84
56
66
92
92
80
60
90
62
32
82
82
30
50
64
46
42
40
26

MODULAR THERMOELECTRIC ASSEMBLY

RELATED APPLICATION

This is a continuation-in-part of pending patent application Ser. No. 08/047,695 filed Apr. 14, 1993, now U.S. Pat. No. 5,315,830 entitled "Modular Thermoelectric Assembly" of same assignee.

TECHNICAL FIELD OF THE INVENTION

This invention relates to thermoelectric devices and more particularly to the use of a thermoelectric assembly to maintain the temperature of a container, box, or any other type of enclosed structure within a desired temperature range.

BACKGROUND OF THE INVENTION

The basic theory and operation of thermoelectric devices has been developed for many years. Modern thermoelectric devices typically include an array of thermocouples which operate by using the Peltier effect. Thermoelectric devices are essentially small heat pumps which follow the laws of thermodynamics in the same manner as mechanical heat pumps, refrigerators, or any other apparatus used to transfer heat energy. The principal difference is that thermoelectric devices function with solid state electrical components (thermocouples) as compared to more traditional mechanical/fluid heating and cooling components.

When DC electrical power is applied to a thermoelectric device having an array of thermocouples, heat is absorbed on the cold side of the thermocouples and passes through the thermocouples and is dissipated on the hot side of the thermocouples. A heat sink (sometimes referred to as the "hot sink") is preferably attached to the hot side of the thermoelectric device to aid in dissipating heat from the thermocouples to the adjacent environment. In a similar manner a heat sink (sometimes referred to as a "cold sink") is often attached to the cold side of the thermoelectric device to aid in removing heat from the adjacent environment. Thermoelectric devices are sometimes referred to as thermoelectric coolers. However, since they are a type of heat pump, thermoelectric devices can function as either a cooler or a heater.

There are a wide variety of containers and enclosed structures which are designed to be maintained within a selected temperature range. Examples of such containers and enclosed structures include, but are not limited to, "ice chests", picnic coolers, cabinets containing sensitive electronic equipment, and organ transplant containers. The use of thermoelectric devices which operate on a 12-volt DC system are well known to maintain desired operating temperatures in portable refrigerators or cooler associated with various types of motor vehicles. An example of a container having a thermoelectric cooler is shown in U.S. Pat. No. 4,726,193 entitled "Temperature Controlled Picnic Box". This patent is incorporated by reference for all purposes within this application.

SUMMARY OF THE INVENTION

In accordance with the present invention, disadvantages and problems associated with previous thermoelectric assemblies used to maintain selected temperatures in an enclosed structure or container have been substantially reduced or eliminated.

A modular thermoelectric assembly including a thermoelectric device along with two associated heat sinks (sometimes referred to as the hot sink and the cold sink) are provided for installment in a container or enclosed structure. A layer of insulating material is disposed between the hot sink and the cold sink. Depending upon whether the thermoelectric assembly will be used to raise or lower the temperature within the enclosed structure, either the hot sink or the cold sink is positioned within the enclosed structure and the other heat sink is positioned outside the enclosed structure. If desired for some applications, the polarity of this electrical power supplied to the thermoelectric device may be reversed to reverse the function of the hot sink and the cold sink. Also, various liquids and fluids may be placed within this container or enclosed structure for heating or cooling as desired.

In accordance to one aspect of the present invention, a modular thermoelectric assembly is provided with a thermoelectric device having a first heat sink secured to the hot side of the thermoelectric device (hot sink) and a second heat sink secured to the cold side of the thermoelectric device (cold sink). A layer of insulating material is disposed between the hot sink and the cold sink with the thermoelectric device contained within the insulating layer. An electrical motor may be secured to either the hot sink or the cold sink with a rotating shaft extending through the electrical motor and both the hot sink and the cold sink. Propellers are provided on each end of the rotating shaft to assist with the circulation of air relative to the respective hot sink and cold sink. Alternatively, an impeller may be provided on the end of the shaft disposed within the container. This impeller assists with the circulation of a liquid relative to whichever sink is disposed within the container. If the modular thermoelectric assembly will be used to lower the temperature of the associated container, the hot sink is positioned exterior from the container with the electrical motor preferably attached thereto. If the thermoelectric assembly is used as a heater, the hot sink and attached electrical motor will preferably be positioned within the container.

A significant technical advantage of the present invention is that the modular thermoelectric assembly may be used with a wide variety of containers, boxes and other types of enclosed structures. By modifying the geometric configuration of the hot sink, cold sink, and the layer of insulating material disposed between the hot sink and the cold sink, the modular thermoelectric assembly may be installed into any container, box or other enclosed structure having an opening with a corresponding geometric configuration. The modular thermoelectric assembly may be installed after the container or enclosed structure has been fabricated without requiring access to the interior of the container or enclosed structure.

Another important technical advantage of the present invention results from placing the layer of insulating material between the hot sink and the cold sink with the thermoelectric device disposed within the insulating layer and an electrical motor with its rotating shaft secured to either the hot sink or the cold sink as desired. By securing the electrical motor with either the hot sink or cold sink and extending the rotating shaft through the hot sink, the insulating layer and the cold sink, a compact modular assembly is provided which may be installed within a relatively small opening in the selected container. The present invention allows reducing the size of the opening in the container to the minimum required to receive the heat sink which will be positioned within the container. The present invention eliminates the need for any additional openings into the container for installation of the electrical motor and/or rotating shaft.

A further technical advantage of the present invention results from attaching the electrical motor to one of the heat sinks and extending a rotating shaft through the electrical motor, both heat sinks and the insulating material. This configuration allows attachment of propellers on each end of the rotating shaft adjacent to the respective heat sinks to significantly improve air flow over the respective heat sinks. By improving the air flow, the efficiency of the respective heat sinks is increased which allows the size of the heat sinks to may be reduced and/or the cooling and heating capacity of the thermoelectric assembly to be increased.

Another significant technical advantage of the present invention results from positioning an electrical motor and associated propeller or fan adjacent to a thermoelectric device. This arrangement allows the propeller to force air to impinge directly on heat transfer surfaces associated with the thermoelectric device. By forcing air to flow directly over these surfaces, the efficiency of the thermoelectric device is substantially increased.

Still another technical advantage of the present invention results from circulating a liquid within the container relative to the cold sink. This circulation allows the temperature of the liquid to be lowered close to the liquid's freezing point without the liquid actually freezing.

A further technical advantage of the present invention results from a predetermined rate at which a liquid within the container is circulated relative to the cold sink. Such circulation allows a layer of frozen liquid to form along the outer surface of the cold sink. Warmer liquid, upon entering the container, melts part of this layer and consequently loses some of its heat energy. Thus, the frozen layer cools the entering liquid more quickly than would the cold sink and thermoelectric device acting alone.

In accordance with another aspect of the present invention, a modular thermoelectric assembly is provided with one or more temperature sensors to control operation of a thermoelectric cooler and electrical motor associated with the modular thermoelectric assembly. The present invention allows installation of one or more temperature sensors between the power supply and the thermoelectric cooler with a minimum number of electrical connections which reduces manufacturing costs and enhances the reliability of the associated modular thermoelectric assembly.

BRIEF DESCRIPTION OF THE DRAWINGS

For a more complete understanding of the present invention, and the advantages thereof, reference is now made to the following written description taken in conjunction with the accompanying drawings, in which.

DETAILED DESCRIPTION OF THE INVENTION

The preferred embodiments of the present invention and its advantages are best understood by referring to FIGS. 1 through 7 of the drawings, like numerals being used for like and corresponding parts of the various drawings.

Figure 1:
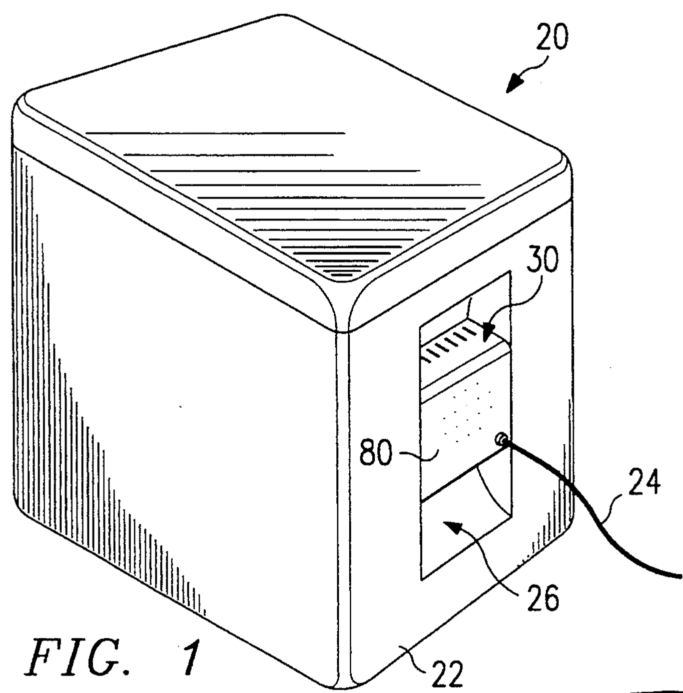
FIG. 1 is an isometric drawing of a container or enclosed structure having a modular thermoelectric assembly incorporating the present invention.

As shown in FIG. 1, container or enclosed structure 20 includes modular thermoelectric assembly 30 disposed within end 22 of container 20. Container 20 could be any type of enclosed structure such as an ice chest, picnic cooler, cabinet for electronic equipment, pharmaceutical storage, organ transplant container, etc. Container 20 may be a permanently mounted enclosure in a building or in a motor vehicle such as an automobile or airplane, or a hand carried portable container. An important feature of the present invention is the ability to modify thermoelectric assembly 30 for use with any type of enclosed structure or container.

Thermoelectric assembly 30 includes thermoelectric device 32 with first heat sink 40 and second heat sink 50 disposed on opposite sides thereof. Thermoelectric device 32 preferably includes a plurality of thermocouples or thermoelectric elements 34 disposed between thermally conductive plates 36 and 38. For some applications, plates 36 and 38 may be formed from ceramic and/or composite materials as desired. Thermoelectric elements 34 may be selected from materials such as bismuth telluride to provide an array of P-N junctions with the desired thermoelectric characteristics to allow thermoelectric device 32 to function as a heat pump.

Thermoelectric elements 34 are preferably connected electrically in series and thermally in parallel by plates 36 and 38. Conductor or electrical power cord 24 is provided to supply electrical energy from a 12 volt DC power supply (not shown). The power supply can be a battery, DC power generator, AC/DC converter, or any other appropriate source of DC electrical power. When DC electrical power is supplied to thermoelectric device 34, heat is absorbed on the cold side represented by plate 38 and passes through thermoelectric elements or thermocouples 34 and is dissipated on the hot side at plate 36.

The efficiency of thermoelectric device 32 is substantially improved by attaching first heat sink 40 to hot plate 36 and second heat sink 50 to cold plate 38. Since heat sink 40 is attached to hot plate 36, it is sometimes referred to as the hot sink. In the same manner, since heat sink 50 is attached to cold plate 38, it is sometimes referred to as the cold sink. Appropriate bonding techniques such as soldering (not shown) may be used to assemble ceramic plates 36 and 38 with thermoelectric elements 34 disposed therebetween. Appropriately sized bolts and screws (not shown) may be used to assemble heat sinks 40 and 50 with thermoelectric device 32 disposed therebetween.

Heat sinks 40 and 50 are shown as fin type heat exchangers extruded as a single unit from appropriate material such as aluminum or copper. Heat sinks 40 and 50 could be manufactured from other types of material having the desired thermal conductivity and strength characteristics. In addition, other heat exchangers designs such as pin fin, slotted fin heat or fin welded heat sinks could be used in place of the single unit extruded heat sinks shown in FIGS. 2, 3 and 4.

Layer 42 of appropriate insulating material such as neoprene foam, polystyrene, polyurethane or cork is disposed between heat sinks 40 and 50. For many applications, neoprene foam is the preferred material for insulating layer 42. Heat sink 40 and insulating layer 42 cooperate to provide means for installing modular thermoelectric assembly 30 within an appropriately sized opening into enclosed structure 20. Since heat sink 40 is generally designed to have a larger surface area than cold sink 50, portion 44 of insulating material 42 extends beyond the periphery of heat sink 50 to form a flange suitable for engagement with opening 26 in container 20.

Heat sink 40 insulating layer 42 and heat sink 50 are shown in FIGS. 1 through 4 as having a generally rectangular cross-section. Opening 26 which extends through end 22 of container 20 includes a similar rectangular configuration for engagement with portion 44 on the periphery of insulating material 42. An important feature of the present invention is that heat sink 40, insulating layer 42 and heat sink 50 may be modified to have any geometric configuration such as circular, oval or triangular as appropriate for the specific container or enclosed structure in which modular thermoelectric assembly 30 will be installed.

The present invention allows optimizing the geometric configuration of the thermoelectric assembly to reduce costs of installation within a selected container or enclosed structure while at the same time enhancing the cooling/heating efficiency of thermoelectric device 32. The present invention allows maximizing the efficiency of the hot sink and/or the cold sink depending upon the application in which the thermoelectric assembly will be used. For some applications, hot sink 40 may be positioned within the enclosed structure and cold sink 50 on the exterior. For other applications, the polarity of the electrical power supplied to thermoelectric device 32 may be reversed to reverse the function of hot sink 40 and cold sink 50. Therefore, a thermoelectric assembly incorporating the present invention may be installed into an enclosed structure or container without having access to the interior of the enclosed structure or container to either cool or heat the interior.

Heat sink 40 and insulating layer 42 cooperate to function as structural support for thermoelectric assembly 30 within opening 26. Insulating layer 42 also functions as a gasket to form a fluid barrier between heat sink 40 and opening 26. Insulating layer 42 also provides a vapor barrier to block opening 26 and prevent undesired air flow therethrough.

Electrical motor 60 is preferably secured to first heat sink 40. Electrical conductor 24 is used to supply power to electrical motor 60. Rotating shaft 62 preferably extends through electrical motor 60, heat sink 40, insulating layer 42 and heat sink 50. Seals (not shown) may be provided between the exterior of rotating shaft 62 and the adjacent portions of insulating layer 42 to prevent undesired air flow along shaft 62. Propeller 64 is attached to the end of rotating shaft 62 extending from heat sink 40. Propeller 66 is attached to the other end of shaft 62 extending from heat sink 50. By positioning propeller 64 adjacent to its associated heat sink 40 and propeller 66 adjacent to its associated heat sink 50, the circulation of air over the respective heat sinks is substantially increased which results in improved efficiency of heat sinks 40, 50 and thermoelectric device 32.

Figure 3:
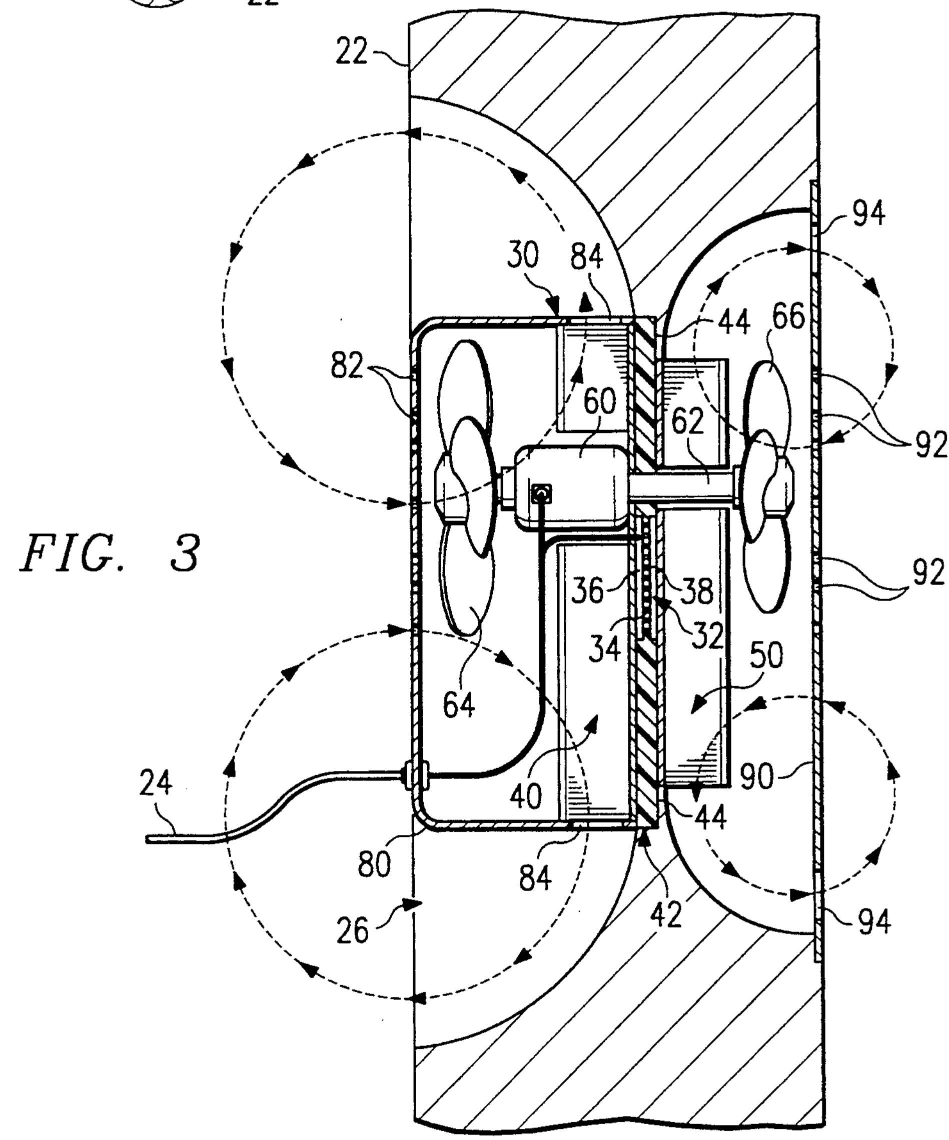
FIG. 3 is a schematic drawing in section and in elevation with portions broken away, showing the modular thermoelectric assembly of FIG. 2 with the preferred air flow paths.

Modular thermoelectric assembly 30 preferably includes cover 80 attached to heat sink 40 and cover 90 disposed over heat sink 50. A plurality of holes 82 are provided in the center of cover 80 and a plurality of holes 92 are provided in the center of cover 90. A plurality of longitudinal slots 84 are provided at each end of cover 80 on opposite sides of holes 82. In the same manner, a plurality of longitudinal slots 94 are provided at each end of cover 90 on opposite sides of holes 92. The rotation of shaft 62 and the orientation of the blades carried by propellers 64 and 66 are selected such that when shaft 62 is rotated by electrical motor 60, air will be drawn inwardly through holes 82 in cover 80 and holes 92 in cover 90. The air is exhausted from slots 84 at each end of cover 80 and slots 94 at each end of cover 90. Slots 84 are preferably aligned with fins 46 of heat exchanger 40. Thus, electrical motor 60 rotating shaft 62, propellers 64 and 66 cooperate with covers 80 and 90 to provide the optimum air circulation flow path with respect to fins 46 of heat sink 40 and fins 56 of heat sink 50. The preferred air circulation flow path is shown in FIG. 3 of the drawings. A portion of the air flow path is generally normal to the heat transfer surfaces associated with heat sinks 40 and 50 and hot side 36 and cold side 38 respectively. Another portion of the air flow path is parallel with fins 46 and 56 of heat sinks 40 and 50 respectively. Insulating layer 42 cooperates with heat sink 40 and opening 26 to prevent undesired mixing of the air circulated by propellers 64 and 66 respectively.

A thermoelectric assembly incorporating the present invention can function satisfactorily without covers 80 and/or 90. The use of covers 80 and/or 90 enhances the efficiency of the assembly. Modular thermoelectric assembly 130 is shown in FIG. 4 without covers 80 and 90.

Figure 2:
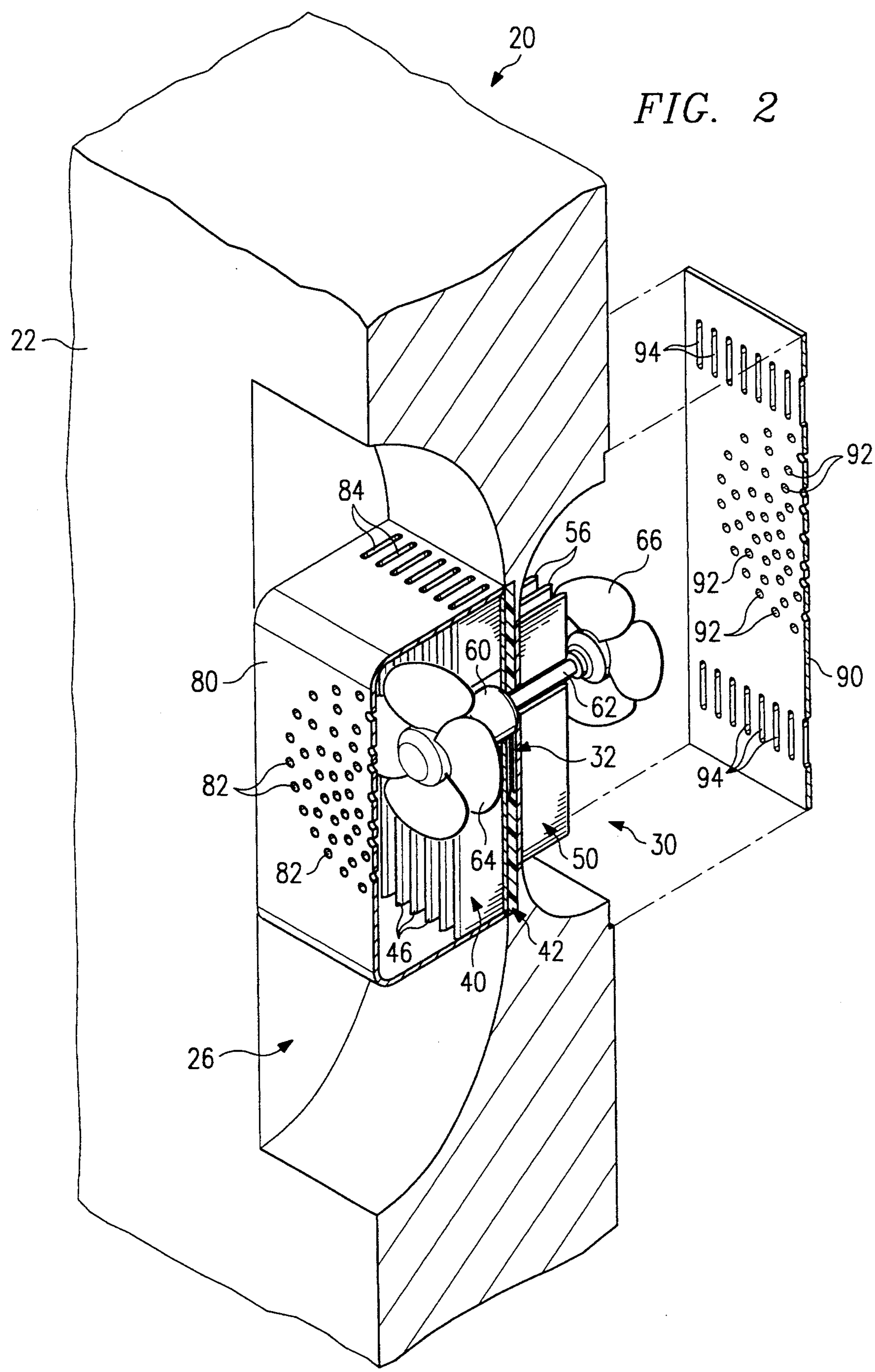
FIG. 2 is an enlarged isometric drawing, in section and in elevation with portions broken away, of the modular thermoelectric assembly and container of FIG. 1.
Figure 4:
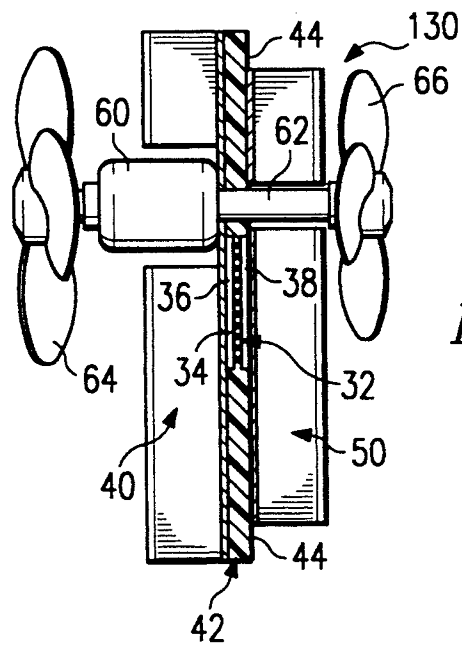
FIG. 4 is a drawing in elevation and in section showing a modular thermoelectric assembly incorporating the present invention.

As shown in FIGS. 2, 3 and 4, electrical motor 60 and rotating shaft 62 are preferably disposed adjacent to thermoelectric device 32. This location for electrical motor 60 and rotating shaft 62 allows propellers 64 and 66 to force air to directly contact heat the transfer surfaces associated with hot side 36 and cold side 38 of thermoelectric device 32. This direct impingement of air, particularly from propeller 64 onto the heat transfer surfaces associated with hot plate 36, has substantially increased the efficiency of thermoelectric device 32.

For some applications, it may not be required to install both propellers 64 and 66. Depending upon the amount of heat which will be transferred by the specific modular thermoelectric assembly, either propeller 64 or 66 may be eliminated. Also, impellers could be used to replace propellers 64 and/or 66 if desired. For some applications, electrical motor 60 and rotating shaft 62 may not be required. For these applications, the natural convection of air over heat sinks 40 and 50 would be used to provide the desired heat transfer with the surrounding environment.

Since the present invention results in a compact modular thermoelectric assembly of heat sinks, insulating material, thermoelectric device, electrical motor and propellers, the modular thermoelectric assembly may be installed on the top, bottom, side, front or any other desired portion of an enclosed structure or container. The only requirement is that the opening in the container have a geometric configuration which matches the configuration of the heat sinks and insulating layer used to manufacture the specific thermoelectric assembly. Also, the present invention may be used with other DC power supplies and is not limited to 12 volt DC power.

Figure 5:
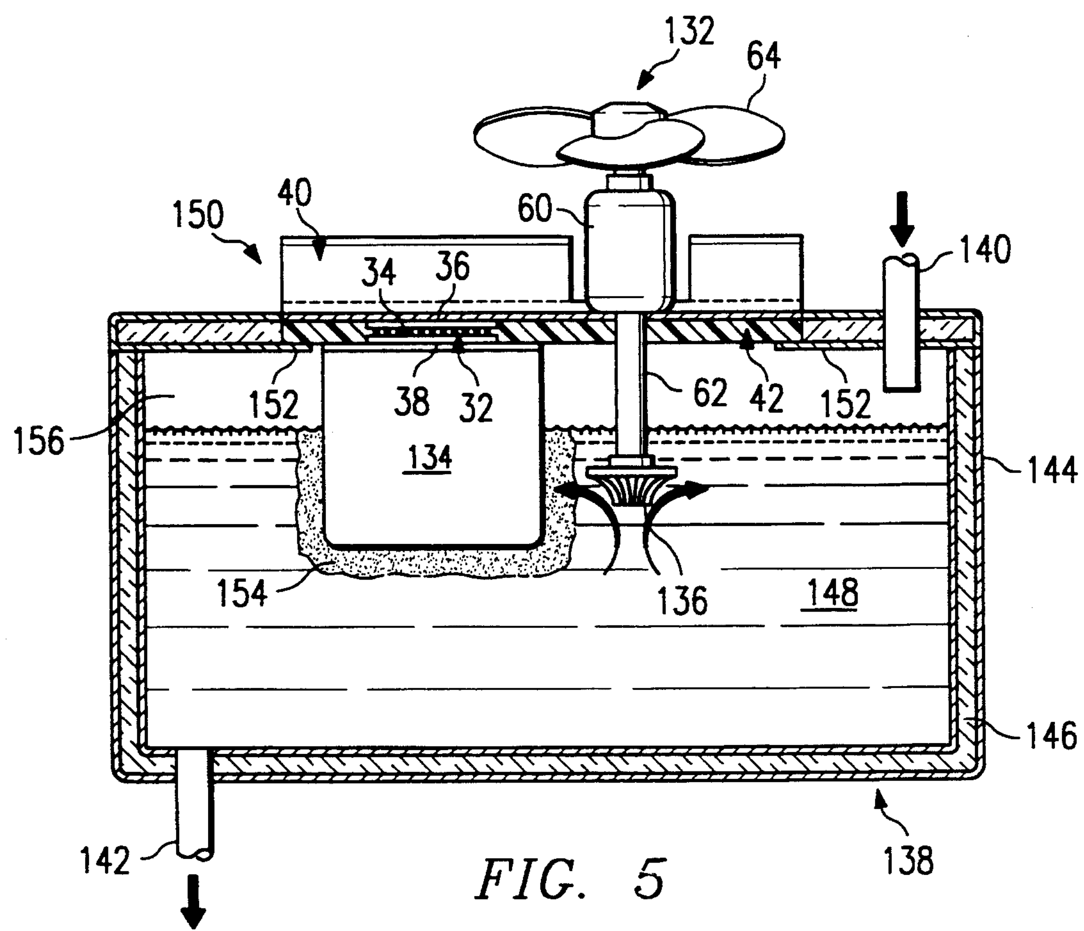
FIG. 5 is a drawing in elevation and in section with portions broken away showing a modular thermoelectric assembly incorporating the present invention for use with a container of water or other liquids.
Figure 6:
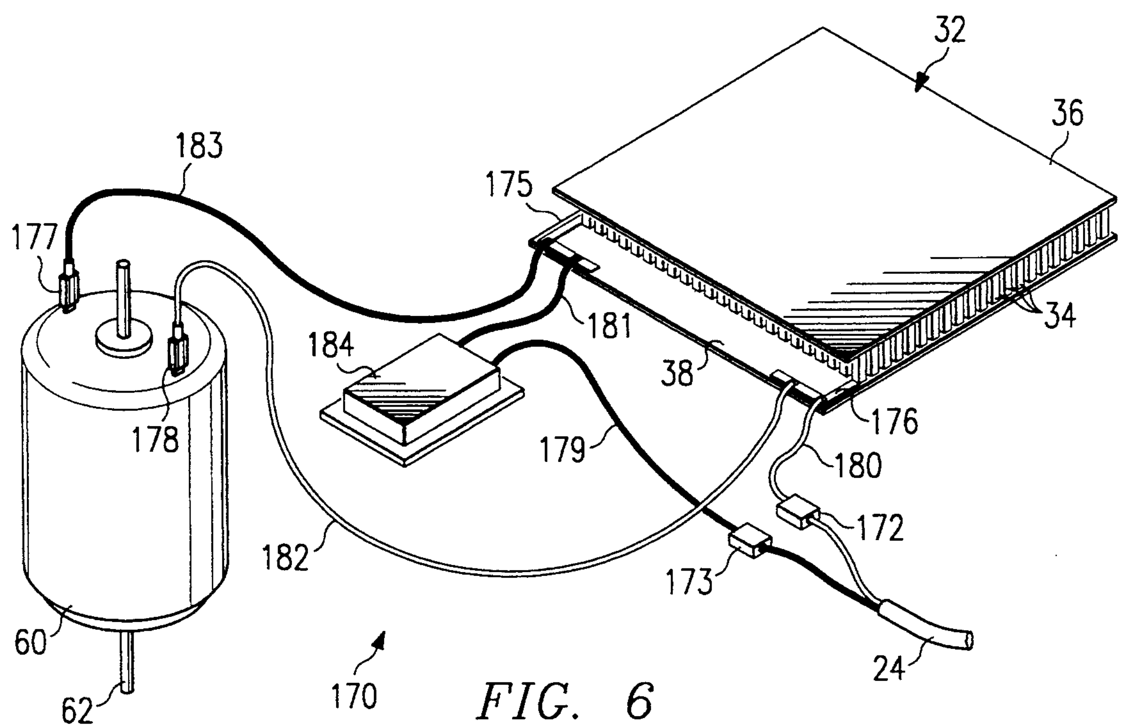
FIG. 6 is a schematic drawing in elevation with portions broken away showing a temperature sensor electrically connected with a modular thermoelectric assembly incorporating the present invention.
Figure 7:
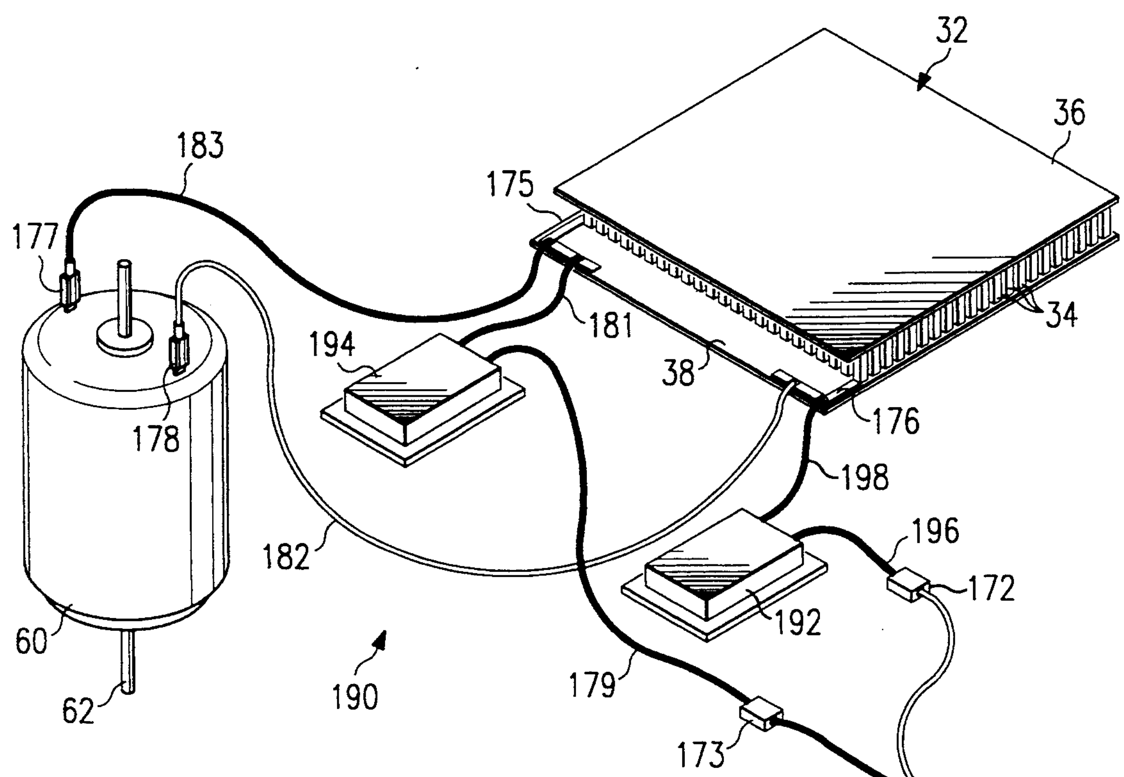
FIG. 7 is a schematic drawing in elevation with portions broken away showing two temperature sensors electrically connected with a modular thermoelectric assembly incorporating the present invention.

FIG. 5 illustrates a modular thermoelectric cooling assembly 132 as another embodiment of modular assembly 130 of FIG. 4. Modular cooler 132 is particularly suited for the cooling of liquids.

As previously described in reference to assembly 130, modular cooler 132 includes thermoelectric device 32 having thermoelectric elements 34 disposed between hot plate 36 and cold plate 38. Hot plate 36 is attached to hot sink 40 while cold plate 38 is attached to cold sink 134. Cold sink 134 may sometimes be referred to as a "cold finger 134" since cold sink 134 is designed for cooling liquids. As discussed above, heat sink 40 and cold finger 134, along with modular cooler 132, may be suitably coupled together as shown by the use of appropriately sized bolts and screws. Insulation layer 42 separates hot sink 40 from cold finger 134.

Propeller 64 is attached to one end of shaft 62 which extends through motor 60. Motor 60 is disposed within and attached to hot sink 40. A cover (not shown) such as cover 82 of FIGS. 2 and 3 may be disposed over hot sink 40 and propeller 64. An impeller 136 is attached to the other end of shaft 62. In other embodiments, impeller 136 can be substituted with a propeller such as propeller 66 of FIG. 4.

Modular assembly 132 is typically used to cool water 148 in a water drinking fountain (not shown). Such a fountain typically includes a tank 138 having a water inlet 140 and a water outlet 142. Walls 144 of tank 138 are typically hollow and have disposed therein an insulation layer 146 to aid in keeping water 148 cool.

Modular assembly 132 is installed in opening 150 of tank 138 and is attached to flange 152. Insulation layer 42 provides insulation for opening 150, thus complimenting the insulation provided by insulation layer 146. Additionally, insulation layer 42 provides a fluid barrier between the interior and exterior of tank 138 by forming a seal along flange 152. Insulation layers 42 and 146 may be neoprene foam or any other suitable insulation material such as polystyrene, polyurethane or cork. Assembly 132 and flange 152 may be suitably coupled together as shown by the use of appropriately sized bolts and screws. A seal (not shown) may be placed around the portion of shaft 62 which is adjacent to insulation layer 142. This seal provides a fluid barrier along shaft 62 between the interior and exterior of tank 138.

In operation, a thermostat (not shown) controls the thermoelectric device 32 in order that the temperature of the water 148 will remain relatively constant. Typically, the temperature of the water is kept at approximately 0° Celsius (C). Motor 60 rotates shaft 62 which in turn rotates propeller 64 and impeller 136. Propeller 64 aids hot sink 40 in the dissipation of heat as set out previously with regard to modular thermoelectric assembly 130.

Impeller 136 circulates water 148 as shown by the directional arrows. This circulation provides the advantage of allowing water 148 to be cooled to approximately 0° C. without freezing into a solid block of ice and possibly damaging tank 138. Typically, water 148 is circulated at a predetermined rate such that a layer of ice 154 is allowed to form along the portion of cold finger 134 which is disposed within water 148. The advantages associated with ice layer 154 are discussed below.

Tank 138 may contain a layer of air 156. Cool water being drawn from outlet 142 allows relatively warm water to enter through inlet 140 to keep tank 138 filled with an approximately constant level of water 148. As relatively warm water (typically tap water warmer than 0° C.) enters inlet 140 and mixes with water 148, the temperature of water 148 increases. This temperature increase is distributed throughout the body of water 148 by the circulation action resulting from the rotation of impeller 136.

The distributed temperature increase causes a portion of ice layer 154 to melt. The melting of ice requires a certain amount of energy. This energy amount is called the "heat of fusion" of water, which equals 80 calories/-gram. That is, 80 calories must be supplied to melt 1 gram of ice to water at 0° C. Thus, this melting of the ice actually assists in absorbing heat from the tap water which enters through inlet 140. In fact, ice layer 154 provides a significant reduction in time to cool entering water over that of similar systems not having an ice layer. Cold finger 134 via thermoelectric device 32 rebuilds ice layer 154 during periods of time when a reduced volume of water is being drawn into tank 138 via inlet 140. Thus, ice layer 154 acts as a "cold" battery which loses some of its "charge" when tap water enters tank 138. This "cold" battery is "recharged" during periods when little or no tap water enters tank 138.

Although the embodiment shown in FIG. 5 is described in connection with cooling water in a water cooler, modular assembly 132 is suited to cool other liquids as well. This is especially true for liquids whose freezing point will allow a frozen layer of the liquid to form on cold finger 134. Additionally, motor 60 of FIG. 5 may alternatively have a stall feature. Such a feature allows for quickly shutting down motor 60 when the combined current drawn by it and thermoelectric device 32 exceeds a predetermined limit.

Various component configurations and electrical circuits may be used to supply energy from electrical power cord 24 to thermoelectric device 32 and electrical motor 60. Examples of these alternative configurations include electrical circuit 170 shown in FIG. 6 and electrical circuit 190 shown in FIG. 7. Since thermoelectric device 32 and electrical motor 60 typically operate with DC electrical power, electrical circuits 170 and 190 may be described as having a "positive" portion and a "negative" portion.

The principal components of electrical circuit 170 include electrical connectors 172 and 173 which are used to attach power cable 24 to the positive portion and the negative portion respectfully of electrical circuit 170. The positive portion of electrical circuit 170 includes electrical connector 172, positive terminal or connector 76 on thermoelectric device 32, positive terminal or electrical connector 178 on motor 60, and wires or leads 180 and 182 extending between and electrically attached with connectors 172, 176 and 178. The negative portion of electrical circuit 170 includes connector 173, temperature sensor 184, negative terminal or electrical connector 175 on thermoelectric device 32, negative terminal or electrical connector 177 on motor 60 and wires or leads 179, 181 and 183 extending between and electrically attached with these components.

Electrical connector 176 is provided on thermally conductive plate 38 to supply electrical power to thermoelectric elements 34 and to motor 60 via wire 182. Temperature sensor 184 which will be described later in more detail is preferably connected electrically in series between connectors 173 and 175 by electrical leads 179 and 181.

Temperature sensor 184 may be attached to either heat sink 40 or heat sink 50. The location of temperature sensor 184 depends upon which heat sink will be used to control the operation of the associated modular thermoelectric assembly. If temperature control on the cold side is more important, temperature sensor 184 may be disposed adjacent to heat sink 50 or 134. If temperature control on the hot side is more important, temperature sensor 184 may be disposed adjacent to heat sink 40. The location of temperature sensor 184 depends upon the intended purpose and function of the associated modular thermoelectric assembly and associated container.

The principal components of electrical circuit 190 are substantially the same as the principal components of electrical circuit 170 except temperature sensors 192 and 194 have been installed respectively in the positive portion and the negative portion of electrical circuit 190. By including temperature sensors 192 and 194, electrical circuit 190 allows controlling the operation of the associated modular thermoelectric assembly dependent upon the temperature of each heat sink 40 and 50. Electrical circuit 190 may be particularly applicable when temperature control is required for both the hot side and the cold side of the associated modular thermoelectric assembly. To accommodate installation of temperature sensor 192 in the positive portion of electrical circuit 190, electrical leads 196 and 198 are provided between connectors 172 and 176.

Various types of temperature control mechanisms may be satisfactorily used as temperature sensors 184, 192 and 194. These temperature sensors may be relatively simple thermostats having a bimetallic strip which will open electrical contacts (not shown) when the temperature of the associated heat sink 40 and/or 50 reaches the desired value to block electrical flow through the associated electrical circuit 170 or 190. Alternatively, temperature sensors 184, 192 and 194 may be relatively complex control mechanisms which monitor temperature, time and other selected parameters to allow considerable flexibility in the operation of the associated modular thermoelectric assembly. An example of a bimetallic thermostat which may be satisfactorily used with the present invention is designated Model J Thermal Protector available from Portage Electric Products, Inc. located at North Canton, Ohio. An example of a more complex programmable temperature sensor and controller which may be satisfactorily used with the present invention is designated CN9000A Autotune Co. available from Omega Engineering located at Stanford, Conn.

For some applications, it may be desirable to place more than one temperature sensor in either the positive portion or the negative portion of electrical circuit 170 and 190. An important feature of the present invention is the increased flexibility in designing the electrical circuit and control system for the associated modular thermoelectric assembly. Temperature sensors 184, 192 and 194 may be used to control both thermoelectric cooler 32 and the forced convection provided by electrical motor 60 and propellers/impellers 64, 66 and 136 with respect to the associated heat sinks 40, 50 and 134.

Although the present invention and its advantages have been described in detail, it should be understood that various changes, substitutions and alterations can be made without departing from the spirit and scope of the invention as defined by the following claims.

What is claimed is:

1. Apparatus for controlling the temperature of a liquid within an enclosed structure comprising:

a thermoelectric device with a first heat sink disposed on one side of the device and a second heat sink disposed on the other side of the device;

a layer of insulating material disposed between the first heat sink an the second heat sink with the thermoelectric device contained within the insulating material;

a portion of the second heat sink disposed within the liquid;

an electrical motor carried by the first heat sink;

a rotating shaft extending longitudinally through the first heat sink and the electrical motor; and a propeller attached to a first end of the rotating shaft adjacent to the first heat sink.

2. The apparatus of claim 1 further comprising:

the first heat sink having a cross-sectional area larger than the cross-sectional area of the second heat sink; and the first heat sink and the insulating material cooperating with each other to provide means for installing the apparatus as a complete unit into the enclosed structure.

3. The apparatus of claim 1 further comprising:

the thermoelectric device having a hot side and a cold side; and the first heat sink attached to the hot side and the second heat sink attached to the cold side.

4. The apparatus of claim 1 further comprising means for circulating the liquid with respect to the second heat sink.

5. The apparatus of claim 4 wherein the liquid circulating means and the air circulating means together comprise:

an electrical motor carried by the first heat sink;

a rotating shaft, having a first end adjacent to the first heat sink and a second end adjacent to the second heat sink, the shaft extending longitudinally through the first heat sink, the motor, the insulating material and the second heat sink;

a propeller attached to the first end; and an impeller attached to the second end.

6. The apparatus of claim 1 wherein the insulating material is selected from the group comprising neoprene foam, polystyrene, polyurethane or cork.

7. The apparatus of claim 1 further comprising:

the thermoelectric device having a hot side and a cold side; and the first heat sink attached to the cold side and the second heat sink attached to the hot side.

8. The apparatus of claim 1 further comprising a cover disposed over the first heat sink to guide the circulation of air with respect to the first heat sink.

9. A modular thermoelectric assembly for installation into a container and for cooling a liquid within the container, the assembly comprising:
- a thermoelectric device for controlling the temperature within the container;
- the thermoelectric device having a hot side and a cold side;
- a hot sink attached to the hot side and a cold sink attached to the cold side, a portion of the cold sink disposed within the liquid;
- a layer of insulating material disposed between the hot sink an the cold sink with the thermoelectric device contained within the insulating material;
- the layer of insulating material and the hot sink sized to engage an opening in the container and to couple the modular thermoelectric assembly to the container for installation of the thermoelectric assembly as a complete unit;
- an electrical motor attached to one of the heat sinks with a rotating shaft extending longitudinally through the electrical motor and the hot sink; and
- a propeller attached to a first end of the rotating shaft adjacent to the hot sink.

10. The modular thermoelectric assembly of claim 9 further comprising:
- an electrical motor attached to the hot sink with a rotating shaft extending longitudinally through the motor, the hot sink and the cold sink;
- a propeller attached to a first end of the shaft adjacent to the hot sink;
- an impeller attached to a second end of the shaft adjacent to the cold sink.

11. The modular thermoelectric assembly of claim 10 further comprising:
- a cover disposed over the hot sink;
- a plurality of holes extending through a center portion of the cover;
- a plurality of longitudinal slots adjacent to the ends of the cover on opposite sides of the holes; and
- the cover associated with the hot sink and the propeller for establishing a preferred air circulation flow path for the hot sink.

12. The modular thermoelectric assembly of claim 9 further comprising the insulating material selected from the group consisting of neoprene foam, polystyrene, polyurethane, or cork.

13. The modular thermoelectric assembly of claim 9 further comprising
- means for circulating the liquid with respect to the cold sink.

14. The modular thermoelectric assembly of claim 13 wherein the air circulating means and the liquid circulating means together comprise:
- an electrical motor disposed within the hot sink;
- a rotating shaft extending longitudinally through the hot sink, the electrical motor, the insulating material and the cold sink;
- a propeller attached to a first end of the shaft adjacent to the hot sink; and
- an impeller attached to a second end of the shaft adjacent to the cold sink.

15. The modular thermoelectric assembly of claim 13 wherein said means for circulating the liquid comprises means for forming a frozen layer of the liquid on the portion of the cold sink.

16. A thermoelectric water cooler comprising:
- a modular thermoelectric assembly comprising:
  - a thermoelectric device having a hot and a cold side, a hot sink attached to the hot side, a cold sink attached to the cold side, a first insulation layer disposed between the hot sink and the cold sink with the thermoelectric device disposed within the insulation layer;
  - an electrical motor attached to one of the heat sinks with a rotating shaft extending longitudinally through the electrical motor and the hot sink; and
  - a propeller attached to a first end of the rotating shaft adjacent to the hot sink; and
- a tank for holding cooled water having an opening for receiving the modular assembly with a portion of the cold sink disposed within the water.

17. The water cooler of claim 16 wherein the tank further comprises a plurality of hollow walls with each wall having a second insulation layer disposed therein.

18. The water cooler of claim 17 wherein the first and second insulation layers are selected from the group comprising neoprene foam, polystyrene, polyurethane or cork.

19. The water cooler of claim 16 wherein the modular assembly further comprises means for circulating water with respect to the cold sink.

20. The water cooler of claim 16 wherein the tank further comprises:
- an inlet through which water enters the tank; and
- an outlet through which the cooled water exits the tank.

21. The water cooler of claim 16 wherein the water circulating means and the air circulating means together comprise:
- an electrical motor attached to the hot sink with a rotating extending longitudinally through the motor, cold sink and hot sink;
- a propeller attached to a first end of the shaft adjacent to the hot sink; and
- an impeller attached to a second end of the shaft adjacent to the cold sink.

22. The water cooler of claim 19 wherein said means for circulating the cooled water comprises means for forming a layer of ice on the cold sink.

23. Apparatus for controlling the temperature of a liquid within an enclosed structure comprising:
- a thermoelectric device with a first heat sink disposed on one side of the thermoelectric device and a second heat sink disposed on the other side of the thermoelectric device;
- a layer of insulating material disposed between the first heat sink and the second heat sink with the thermoelectric device contained within the insulating material;
- an electrical motor attached to one of the heat sinks with a rotating shaft extending longitudinally through the electrical motor and the first heat sink;
- a propeller attached to a first end of the rotating shaft adjacent to the first heat sink;
- a source for supplying electrical power to the thermoelectric device and the electrical motor; and
- a temperature sensor controlling the supply of electrical power to the thermoelectric device and the electrical motor.

24. The apparatus of claim 23 further comprising:
- the temperature sensor disposed adjacent to the first heat sink; and the temperature sensor electrically connected between the source of electrical power and the thermoelectric device an the electrical motor whereby the temperature sensor may block electrical power to the thermoelectric device and the electrical motor.

25. The apparatus of claim 23 further comprising:

the temperature sensor disposed adjacent to the second heat sink; and the temperature sensor electrically connected between the source of electrical power and the thermoelectric device and the electrical motor whereby the temperature sensor may block electrical power to the thermoelectric device and the electrical motor.

26. The apparatus of claim 23 further comprising:

two temperature sensors for controlling the supply of electrical power;

one temperature sensor disposed adjacent to the first heat sink and the other temperature sensor disposed adjacent to the second heat sink; and the temperature sensors electrically connected between the source of electrical power and the thermoelectric device and the electrical motor whereby either temperature sensor may block electrical power to the thermoelectric device and the electrical motor.

27. The apparatus of claim 23 wherein the temperature sensor controls the supply of electrical power to the thermoelectric device and electrical motor responsive to temperature inputs.

28. A modular thermoelectric assembly for installation into a container and for cooling a liquid within the container, the assembly comprising:

a thermoelectric device for controlling the temperature within the container;

the thermoelectric device having a hot side and a cold side;

a first heat sink and a second heat sink attached to the hot side and the cold side respectively;

a layer of insulating material disposed between the first heat sink and the second heat sink with the thermoelectric device contained within the insulating material;

an electrical motor carried by the first heat sink;

a rotating shaft extending longitudinally through the first heat sink, the electrical motor, and the insulating material;

a propeller attached to a first end of the rotating shaft adjacent to the first heat sink; and the layer of insulating material and the first heat sink sized to engage an opening in the container and couple the modular thermoelectric assembly to the container for installation of the modular thermoelectric assembly as a complete unit.

* * * * *